(12) United States Patent
Suzuki

(10) Patent No.: US 6,897,424 B2
(45) Date of Patent: May 24, 2005

(54) CONTROLLING A LASER TO STOP OUTPUT IN ACCORDANCE WITH DETECTION OF OUTPUT LIGHTS CORRESPONDING TO CHANNELS

(75) Inventor: Osamu Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/272,284

(22) Filed: Oct. 17, 2002

(65) Prior Publication Data

US 2004/0208650 A1 Oct. 21, 2004

Related U.S. Application Data

(63) Continuation of application No. PCT/JP00/02536, filed on Apr. 19, 2000.

(51) Int. Cl.⁷ .................................................. G01J 1/32
(52) U.S. Cl. .......................................... 250/205; 398/15
(58) Field of Search .......................... 398/15; 250/205, 250/552, 553, 559.39, 208.2, 208.4; 359/187; 385/31, 88; 372/50, 108

(56) References Cited

U.S. PATENT DOCUMENTS

| 4,988,807 A | 1/1991 | Christensen et al. |
| 5,216,263 A | 6/1993 | Paoli |
| 5,317,170 A | 5/1994 | Paoli |
| 5,337,323 A | * 8/1994 | Rokugawa et al. ............ 372/31 |
| 5,369,524 A | * 11/1994 | Pocholle et al. ............. 359/345 |
| 5,521,736 A | 5/1996 | Swirhun et al. |
| 5,625,480 A | 4/1997 | Swirhun et al. |
| 6,081,638 A | * 6/2000 | Zhou |
| 6,320,694 B1 | * 11/2001 | Ohshima ................ 359/341.33 |

FOREIGN PATENT DOCUMENTS

| EP | 0 441 709 A2 * | 2/1991 |
| EP | 0 441 709 | 8/1991 |
| EP | 0 704 993 | 4/1996 |
| JP | 3-232285 | 10/1991 |
| JP | 4-23419 | 1/1992 |
| JP | 5-2968 | 1/1993 |
| JP | 5-167170 | 7/1993 |
| JP | 9-116218 | 5/1997 |

* cited by examiner

Primary Examiner—Thanh X. Luu
(74) Attorney, Agent, or Firm—Staas & Halsey LLP

(57) ABSTRACT

A parallel optical module is constructed to include a plurality of photodetectors (MD1, MD2) which detect output lights of a plurality of arbitrary channels of a laser light source (3) having a plurality of channels, a plurality of detection and control loops which detect and control intensities of output lights of the laser light source based on detection signals from the plurality of photodetectors, and a control circuit (1) which stops output of the laser light source when an intensity of output light detected by at least one of the plurality of detection and control loops does not satisfy a predetermined standard.

25 Claims, 4 Drawing Sheets

US 6,897,424 B2

CONTROLLING A LASER TO STOP OUTPUT IN ACCORDANCE WITH DETECTION OF OUTPUT LIGHTS CORRESPONDING TO CHANNELS

This application is a continuing application, filed under 35 U.S.C. §111(a), of International Application PCT/JP00/02536, filed Apr. 19, 2000.

TECHNICAL FIELD

The present invention generally relates to parallel optical modules and information processing apparatuses, and more particularly to a parallel optical module which is provided with a laser safety circuit and to an information processing apparatus having such a parallel optical module.

BACKGROUND ART

Recently, due to progresses made in optical communication techniques, communication is often made between information processing apparatuses by connecting the information processing apparatuses via an optical fiber cable and transmitting and receiving optical signals via the optical fiber cable. A laser optical module is used to output a laser beam from a laser light source to the optical fiber cable depending on transmitting information, and is normally provided with a laser safety circuit. The laser safety circuit is provided to control the output, so tat the intensity of the laser beam output from the laser optical module satisfies a laser safety standard.

Conventionally, the laser optical module is designed to primarily make the transmission by a single channel. For this reason, one laser safety circuit is provided within the laser optical module, in correspondence with the single channel.

However, due to increasing amount of information to be transmitted, it is expected that future laser optical modules will make the transmission by a plurality of channels. Hence, there are demands to develop a parallel optical module suited for the communication using the plurality of channels.

On the other hand, the intensity of the parallel transmission output of the laser beam is already prescribed by an international standard such as IEC, and such a laser safety standard must be satisfied from the point of view of safety. However, since the conventional laser optical module is designed to make the transmission by the single channel, only one laser safety circuit is provided. For this reason, when the conventional laser optical module is applied to the parallel optical module having a plurality of channels, there is a problem in that the output cannot be appropriately controlled to satisfy the laser safety standard. Consequently, there are demands to realize a parallel optical module which can make the transmission by the plurality of channels and simultaneously satisfy the laser safety standard related to the intensity of the parallel transmission output of the laser beam.

DISCLOSURE OF THE INVENTION

Accordingly, it is a general object of the present invention to provide a novel and useful parallel optical module and information processing apparatus, in which the problems described above are eliminated.

Another and more specific object of the present invention is to provide a parallel optical module which has a relatively simply structure, is capable of making a transmission by a plurality of channels, and also satisfy a laser safety standard related to an intensity of a parallel transmission output of a laser beam, and an information processing apparatus having such a parallel optical module.

Still another object of the present invention is to provide a parallel optical module comprising a plurality of photodetectors detecting output lights of a plurality of arbitrary channels of a laser light source having a plurality of channels, a plurality of detection and control loops detecting and controlling intensities of output lights of the laser light source based on detection signals from the plurality of photodetectors, and a control circuit stopping output of the laser light source when an intensity of output light detected by at least one of the plurality of detection and control loops does not satisfy a predetermined standard. According to the parallel optical module of the present invention, it is possible to make a transmission by a plurality of channels, and also satisfy a laser safety standard related to the intensity of the parallel transmission output of the laser beam, using a relatively simple structure.

A further object of the present invention is to provide an information processing apparatus comprising a parallel optical module provided with a plurality of photodetectors detecting output lights of a plurality of arbitrary channels of a laser light source having a plurality of channels, a plurality of detection and control loops detecting and controlling intensities of output lights of the laser light source based on detection signals from the plurality of photodetectors and a control circuit stopping output of the laser light source when an intensity of output light detected by at least one of the plurality of detection and control loops does not satisfy a predetermined standard, and a processor supplying data of the plurality of channels to the control circuit. According to the information processing apparatus of the present invention, it is possible to make a transmission by a plurality of channels, and also satisfy a laser safety standard related to the intensity of the parallel transmission output of the laser beam, using a relatively simple structure.

Other objects and further features of the present invention will be apparent from the following detailed description when read in conjunction with the accompanying drawings.

BEST MODE OF CARRYING OUT THE INVENTION

Figure 1:
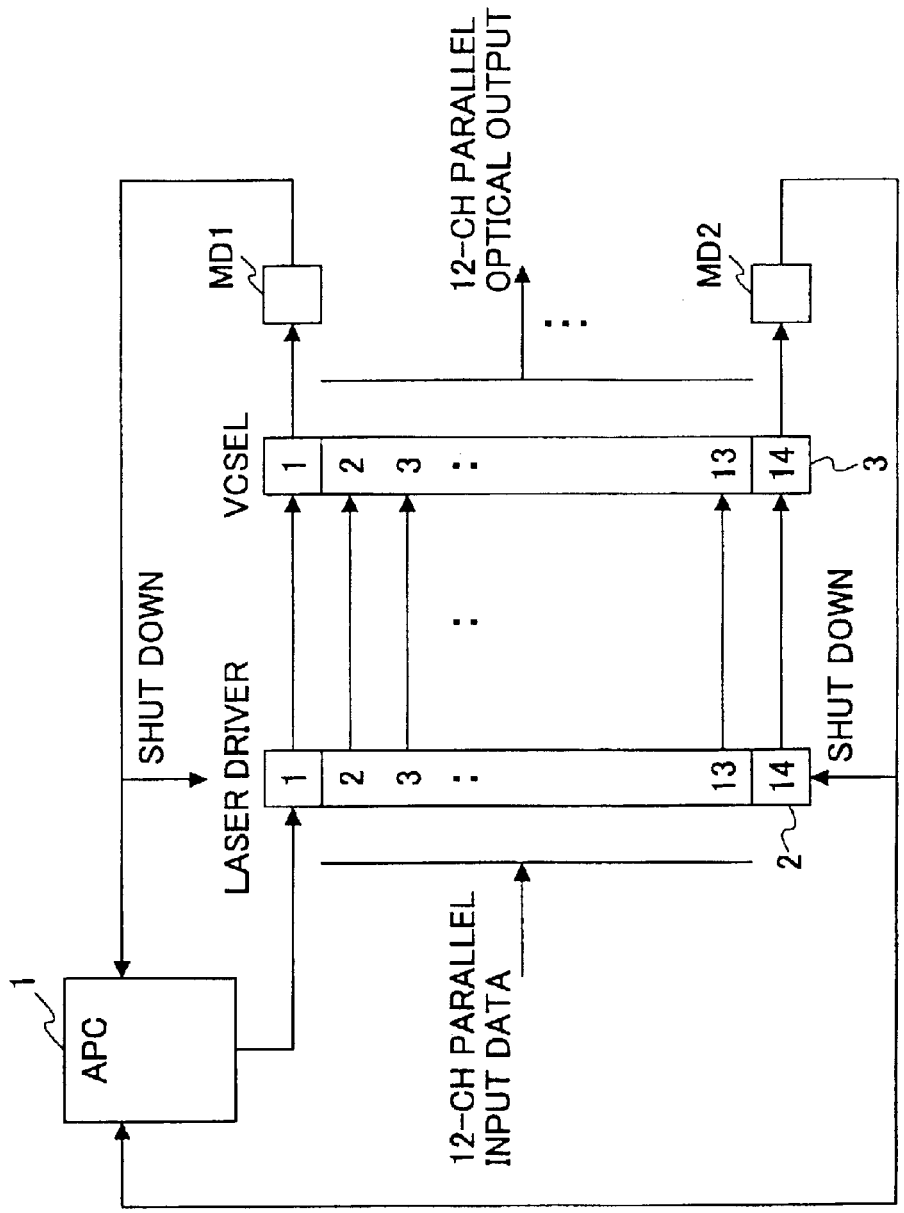
FIG. 1 is a block diagram showing a first embodiment of a parallel optical module according to the present invention.

FIG. 1 is a block diagram showing a first embodiment of a parallel optical module according to the present invention. A parallel optical module includes an APC (Automatic Power Control) circuit 1, a laser driver 2, a surface-emission laser (VCSEL) 3, and monitoring photodiodes MD1 and MD2. The APC circuit 1 and the monitoring photodiode MD1 form a first detection and control loop (or a first laser safety circuit) of a laser safety circuit, and the APC circuit 1 and the monitoring photodiode MD2 form a second detection and control loop (or a second laser safety circuit) of the laser safety circuit. In this embodiment, it is assumed for the sake of convenience that the parallel optical module generates a 12-channel (or 12-bit) parallel optical output, and that two detection and control loops are provided. However, the number of channels of the parallel optical module is of course not limited to twelve, and the number of detection and control loops is of course not limited to two, and both the number of channels and the number of detection and control loops may be any plural number.

The APC circuit 1 controls the laser driver 2 so as to control the intensity of the laser beams output from the surface-emission laser 3. A 12-channel input data dependent on the data to be transmitted is input to the laser driver 2, and the laser driver 2 drives each channel of the surface-emission laser 3 depending on the 12-channel input data. The surface-emission laser 3 has fourteen channels, with first and fourteenth channels being used for output detection, and a total of twelve channels made up of remaining second through thirteenth channels being used for data output. The laser beams output from the second through thirteenth channels of the surface-emission laser 3 are output to a 12-channel optical fiber cable (not shown).

On the other hand, the laser beams output from the first and fourteenth channels of the surface-emission laser 3 are respectively irradiated on the monitoring photodiodes MD1 and MD2. In the case of the surface-emission laser 3, the uniformity of laser diode portions corresponding to each of the channels is good, and the intensities of the laser beams output from each of the channels are approximately the same for the same data. Hence, it is possible to substantially detect the intensities of the laser beams output from the second through thirteenth channels by detecting the intensities of the laser beams output from the first and fourteenth channels by the monitoring photodiodes MD1 and MD2. Detection signals output from the monitoring photodiodes MD1 and MD2 are supplied to the APC circuit 1. The channels in which the intensities of the laser beams are detected by the monitoring photodiodes are of course not limited to the first and fourteenth channels on both ends, and the intensities of the laser beams may be detected in arbitrary channels may be used. In this embodiment, the channels in which the intensities of the laser beams are detected by the monitoring photodiodes are set to the first and fourteenth channels on both ends, of the linearly arranged first through fourteenth channels, by taking into consideration the ease with which the parallel optical module may be connected to the optical fiber cable.

Accordingly, based on the detection signals from the monitoring photodiodes MD1 and MD2 and a current optical characteristic of the surface-emission laser 3, the APC circuit 1 controls laser driving currents supplied to the laser driver 2, so that the intensities of the laser beams output from the surface-emission laser 3 satisfy a predetermined laser safety standard such as the IEC. In addition, in a case where the intensities of the laser beams output from the surface-emission laser 3 cannot be controlled to satisfy the predetermined laser safety standard even when the laser driving currents are controlled, the APC circuit 1 shuts down the laser driving currents to the laser driver 2 for safety reasons.

The above described operation of the laser safety circuit is carried out when turning ON the power of the parallel optical module, when carrying out a reset operation or, when necessary. When carrying out the operation of the laser when necessary, the APC circuit 1 may carry out the control operation described above based on an instruction from a host unit (not shown), for example.

Figure 2:
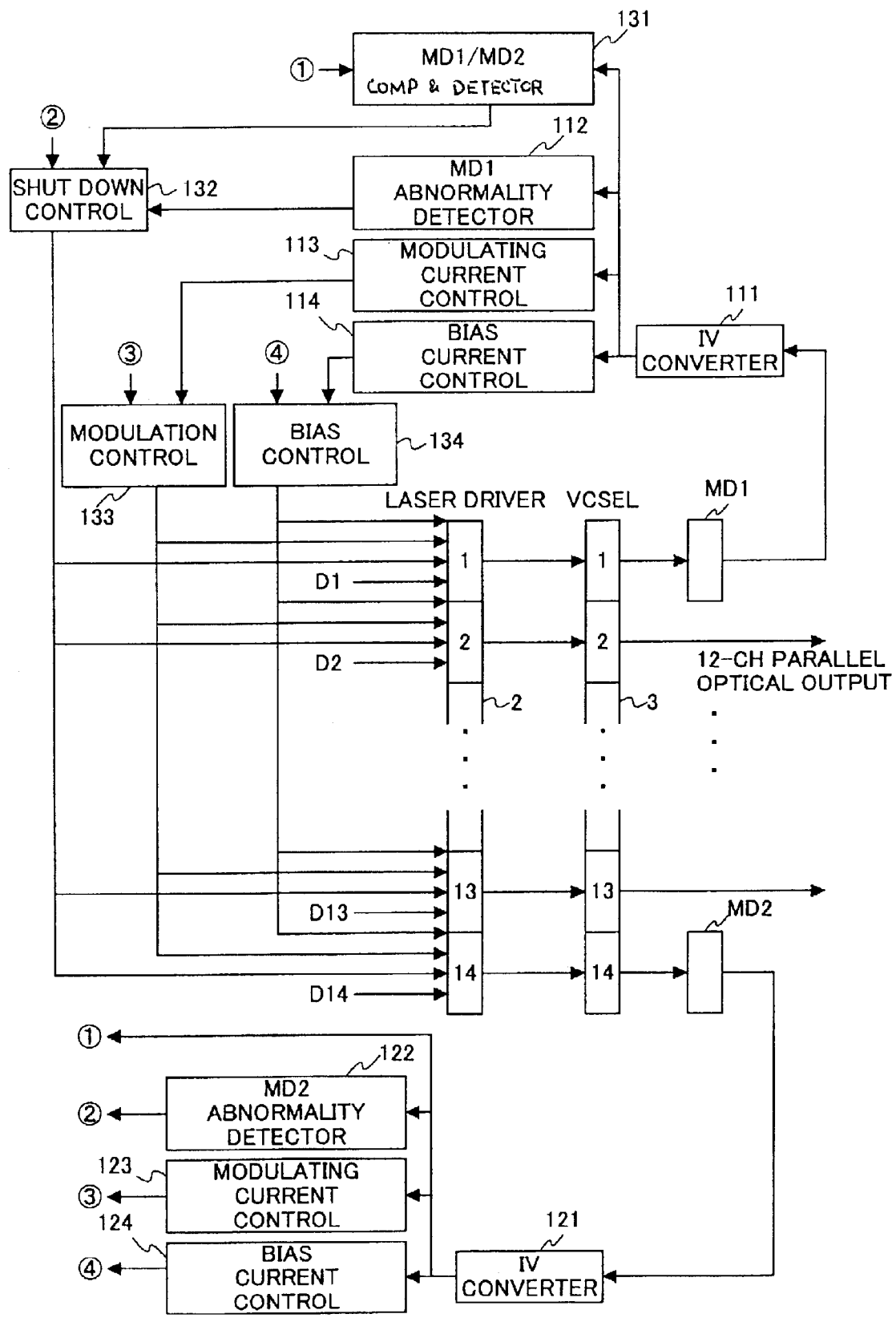
FIG. 2 is a diagram showing a structure of an APC circuit of the first embodiment of the parallel optical module.

FIG. 2 is a diagram showing a structure of the APC circuit 1 in the first embodiment of the parallel optical module. In FIG. 2, those parts which are the same as those corresponding parts in FIG. 1 are designated by the same reference numerals, and a description thereof will be omitted.

As shown in FIG. 2, the APC circuit 1 generally includes a current-to-voltage (IV) converter 111, a MD1 abnormality detector 112, a modulating current control circuit 113, a bias current control circuit 114, a current-to-voltage (IV) converter 121, a MD2 abnormality detector 122, a modulating current control circuit 123, a bias current control circuit 124, an MD1/MD2 comparison and abnormality detector 131, a shut down control circuit 132, a modulation control circuit 133, and a bias control circuit 134.

The IV converter 111 converts the detection signal current from the monitoring photodiode MD1 into a detection voltage, and supplies the detection voltage to the MD1 abnormality detector 112, the modulating current control circuit 113, the bias current control circuit 114, and the MD1/MD2 comparison and abnormality detector 131. The bias current control circuit 114 supplies to the bias control circuit 134 a signal for controlling a bias current depending on the detection voltage from the IV converter 111. The modulating current control circuit 113 supplies to the modulation control circuit 133 a signal for controlling a modulating current depending on the detection voltage from the IV converter 111. The MD1 abnormality detector 112 detects an abnormality of the monitoring photodiode MD1 depending on the detection voltage from the IV converter 111, and supplies an abnormality detection signal to the shut down control circuit 132 when the abnormality is detected. The abnormality of the monitoring photodiode MD1 is detected when the detection voltage from the IV converter 111 exceeds a tolerable maximum voltage value.

Similarly, the IV converter 121 converts the detection signal current from the monitoring photodiode MD2 into a detection voltage, and supplies the detection voltage to the MD2 abnormality detector 122, the modulating current control circuit 123, the bias current control circuit 124, and the MD1/MD2 comparison and abnormality detector 131. The bias current control circuit 124 supplies to the bias control circuit 134 a signal for controlling a bias current depending on the detection voltage from the IV converter 121. The modulating current control circuit 123 supplies to the modulation control circuit 133 a signal for controlling a modulating current depending on the detection voltage from the IV converter 121. The MD2 abnormality detector 122 detects an abnormality of the monitoring photodiode MD2 depending on the detection voltage from the IV converter 121, and supplies an abnormality detection signal to the shut down control circuit 132 when the abnormality is detected. The abnormality of the monitoring photodiode MD2 is detected when the detection voltage from the IV converter 121 exceeds a tolerable maximum voltage value.

The modulation control circuit 133 supplies a modulating current to the laser driver 2 based on the modulating current from the modulating current control circuit 113 or 123. In addition, the bias control circuit 134 supplies a bias current to the laser driver 2 based on the bias current from the bias current control circuit 114 or 124.

The shut down control circuit 132 supplies a shut don signal to the laser driver 2 when the abnormality detection signal is received from any one of the MD1 abnormality detector 112, the MD2 abnormality detector 122 and the MD1/MD2 comparison and abnormality detector 131, so as to shut down the laser driver 2. When the laser driver 2 is shut down, the light emission from the surface-emission laser 3 is forcibly stopped.

Figure 3:
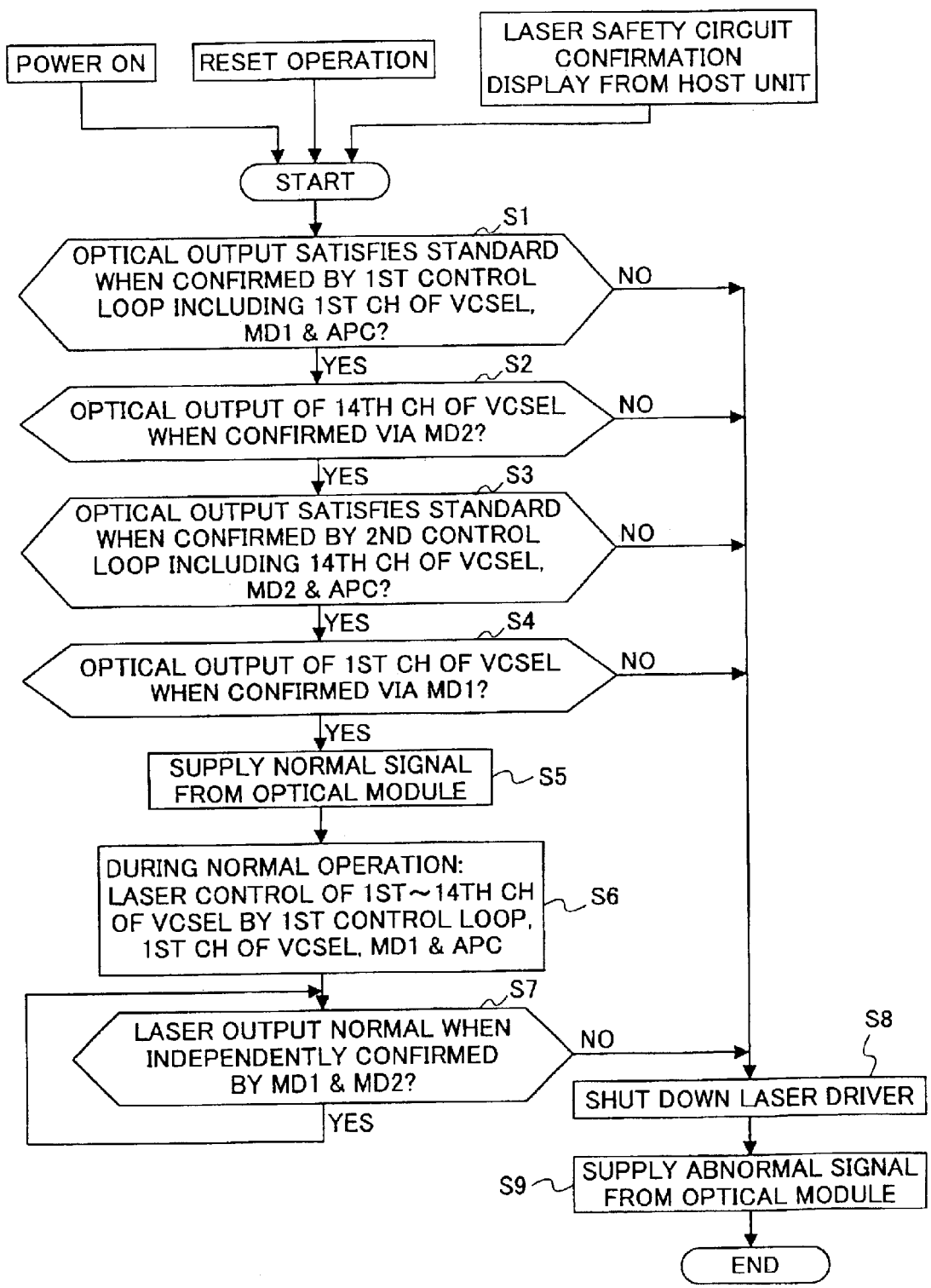
FIG. 3 is a flow chart for explaining an operation of the first embodiment of the parallel optical module.

FIG. 3 is a flow chart for explaining an operation of the first embodiment of the parallel optical module. The operation of the laser safety circuit shown in FIG. 3 is started when the power of the parallel optical module is turned ON, when carrying out a reset operation or, when the operation of the laser safety circuit is necessary, such as when the APC circuit 1 operates based on an instruction from the host unit (not shown), for example.

When the operation is started, a step S1 controls the surface-emission laser 3 via the laser driver 2 by the first detection and control loop, which includes the monitoring photodiode MD1 up to the APC circuit 1, and operates based on the laser beam output from the first channel of the surface-emission laser 3, and decides whether or not the intensity of the laser beam output from the first channel satisfies the predetermined laser safety standard. If the MD1 abnormality detector 112 detects an abnormality in the output of the monitoring photodetector MD1 and the decision result in the step S1 is NO, the process advances to a step S8 which will be described later. On the other hand, if the decision result in the step S1 is YES, a step S2 decides whether or not the intensity of the laser beam output from the fourteenth channel satisfies the predetermined laser safety standard, based on the detection signal which is output from the monitoring photodetector MD2 which detects the laser beam output from the fourteenth channel of the surface-emission laser 3. If the MD2 abnormality detector 122 detects an abnormality of the monitoring photodetector MD2 and the decision result in the step S2 is NO, the process advances to the step S8 which will be described later. Hence, when the intensity of the laser beam output from the first channel satisfies the predetermined laser safety standard by the control of the first detection and control loop, a detection is made to determine whether or not the intensity of the laser beam output from the fourteenth channel satisfies the predetermined laser safety standard.

If the decision result in the step S2 is YES, a step S3 controls the surface-emission laser 3 via the laser driver 2 by the second detection and control loop, which includes the monitoring photodiode MD2 up to the APC circuit 1, and operates based on the laser beam output from the fourteenth channel of the surface-emission laser 3, and decides whether or not the intensity of the laser beam output from the fourteenth channel satisfies the predetermined laser safety standard. If the MD2 abnormality detector 122 detects an abnormality in the output of the monitoring photodetector MD2 and the decision result in the step S3 is NO, the process advances to the step S8 which will be described later. On the other hand, if the decision result in the step S3 is YES, a step S4 decides whether or not the intensity of the laser beam output from the first channel satisfies the predetermined laser safety standard, based on the detection signal which is output from the monitoring photodetector MD1 which detects the laser beam output from the first channel of the surface-emission laser 3. If the MD1 abnormality detector 112 detects an abnormality of the monitoring photodetector MD1 and the decision result in the step S4 is NO, the process advances to the step S8 which will be described later. Hence, when the intensity of the laser beam output from the fourteenth channel satisfies the predetermined laser safety standard by the control of the second detection and control loop, a detection is made to determine whether or not the intensity of the laser beam output from the first channel satisfies the predetermined laser safety standard.

If the decision result in the step S4 is YES, a step S5 supplies a normal signal, which indicates that the parallel optical module is operating normally, to the host unit as status information. This normal signal may be output from the shut down control circuit 132, for example. In addition, a step S6 uses the first detection and control loop or the second detection and control loop to control the modulating current control and the bias current control of the laser driver 2 via the modulation control circuit 133 and the bias control circuit 134, because it is during a normal operation. For the sake of convenience, it is assumed that the first detection and control loop is used during the normal operation to control the modulating current control and the bias current control of the laser driver 2. Thereafter, a step S7 decides whether or not the laser output is normal, based on the detection signals output from the monitoring photodiodes MD1 and MD2, and the process advances to the step S8 if the decision result in the step S7 is NO. The decision result in the step S7 becomes NO when the abnormality detection signal is supplied to the shut down control circuit 132 from any one of the MD1 abnormality detector 112, the MD2 abnormality detector 122 and the MD1/MD2 comparison and abnormality detector 131.

The step S8 supplies the shut down signal to the laser driver 2 from the shut down control circuit 132, in response to the abnormality detection signal received from any one of the MD1 abnormality detector 112, the MD2 abnormality detector 122 and the MD1/MD2 comparison and abnormality detector 131, so as to shut down the laser driver 2. In addition, a step S9 supplies an abnormal signal, which indicates that the parallel optical module is operating abnormally, to the host unit as status information, and the process ends. The abnormal signal may be output from the shut down control circuit 132, for example.

Accordingly, a cross-check of the abnormality generation is made between the first detection and control loop and the second detection and control loop, so as to detect the abnormality of the laser driver 2 and the surface-emission laser 3, and it is also possible to further detect the abnormality in the first detection and control loop and the second detection and control loop. Thus, if there is a possibility that the intensity of the laser output will no longer satisfy the predetermined laser safety standard due to such abnormalities or, that such abnormalities will no longer be detected due to an abnormality in at least one of the first and second detection and control loops, the laser driver 2 is automatically shut down to stop the laser output of the surface-emission laser 3, so as to positively secure safety.

In the embodiment described above, the first and fourteenth channels of the surface-emission laser 3 are provided exclusively with respect to the corresponding first and second detection and control loops, and are not used for data transmission. However, the surface-emission laser 3 may have a structure which is not provided with channels exclusively for the detection and control loops.

For example, when using the first through twelfth channels of the surface-emission laser 3 for the data transmission, the data of a plurality of arbitrary channels of these first through twelfth channels may be detected by monitoring photodiodes of corresponding detection and control loops via an appropriate branching part. In this case, it is desirable that the branching part is constructed so as not to greatly reduce the light intensity of the optical data output to the optical fiber cable from the parallel optical module. In addition, it is possible to employ an arrangement which successively scans the first through twelfth channels. In the case of the structure which directly detects the outputs of the channels used for the data transmission, the laser light source does not necessarily have to be a surface-emission laser.

On the other hand, in the case of the arrangement which detects the outputs of the channels which are not used for the data transmission as in the embodiment described above, the data supplied to these channels may be a predetermined test pattern or data (predetermined bits) of a predetermined data transmission channel, for example.

Figure 4:
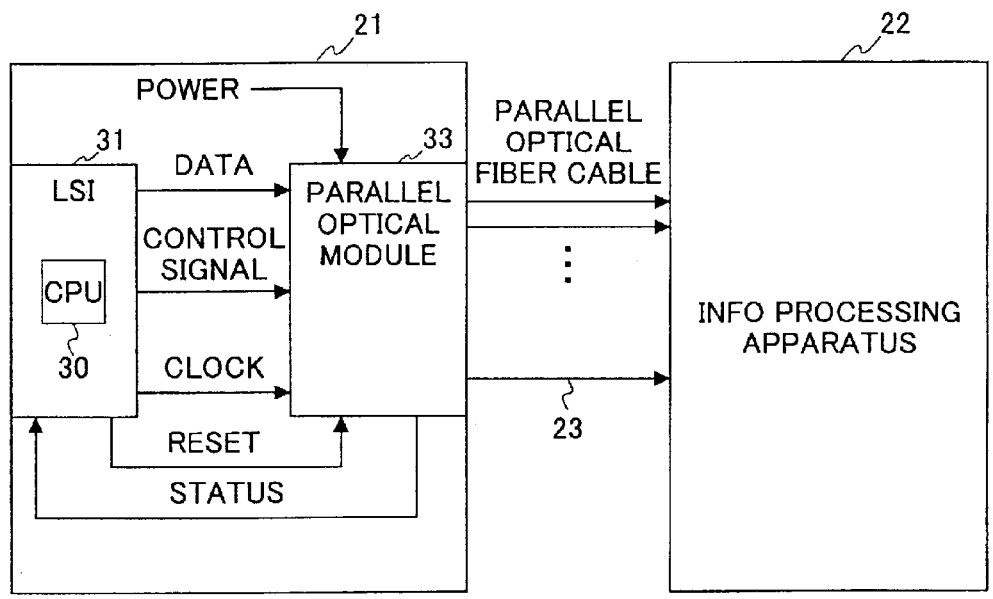
FIG. 4 is a block diagram showing a first embodiment of an information processing apparatus according to the present invention.

Next, a description will be given of a first embodiment of an information processing apparatus according to the present invention. FIG. 4 is a block diagram showing the first embodiment of the information processing apparatus.

As shown in FIG. 4, an information processing apparatus 21 is generally made up of an LSI 31 which includes a CPU 30, and a parallel optical module 33. The parallel optical module 33 has a structure similar to that of the first embodiment of the parallel optical module described above. In this embodiment, it is assumed for the sake of convenience that the information processing apparatus 21 is connected to another information processing apparatus 22 via a parallel optical fiber cable 23. A receiving system within the information processing apparatus 22 may have a known structure, and illustration and description thereof will be omitted.

The CPU 30 forms the host unit with respect to the parallel optical module 33. The CPU 30 supplies data to be transmitted, control signals, one or more clock signals, and one or more reset signals to the parallel optical module 33. The parallel optical module 33 outputs the abnormal signal and the normal signal, which are supplied to the CPU 30 as the status information. When the CPU 30 receives the abnormal signal, the CPU 30 carries out an abnormality process such as notifying the abnormality to a user and stopping the supply of data to the parallel optical module 33.

Figure 5:
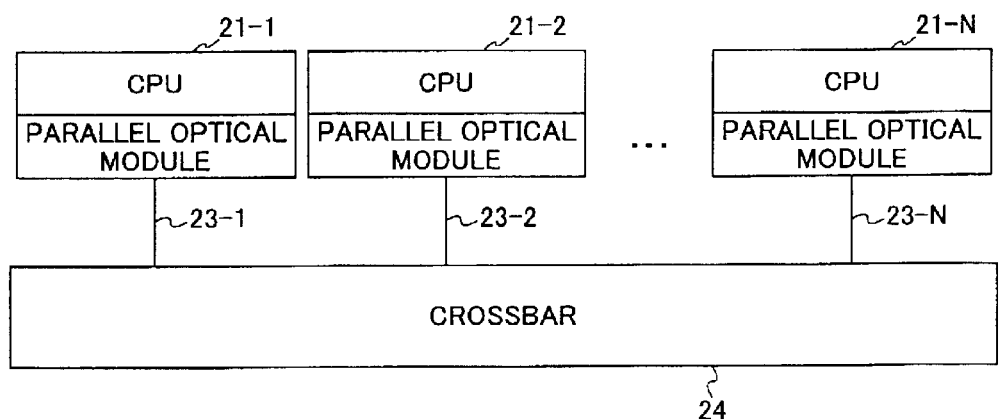
FIG. 5 is a block diagram showing a second embodiment of the information processing apparatus according to the present invention.

Next, a description will be given of a second embodiment of the information processing apparatus according to the present invention. FIG. 5 is a block diagram showing the second embodiment of the information processing apparatus.

The information processing apparatus shown in FIG. 5 is made up of a plurality of information processing apparatuses 21-1 through 21-N. Each of the information processing apparatuses 21-1 through 21-N has the same structure as the information processing apparatus 21 shown in FIG. 4. In this embodiment, it is assumed for the sake of convenience that the information processing apparatuses 21-1 through 21-N are connected to a crossbar 24 via corresponding parallel optical fiber cables 23-1 through 23-N. In other words, one information processing apparatus 21 is connected in a 1:1 relationship to another information processing apparatus 22 in the embodiment shown in FIG. 4, but each information processing apparatus is connected to a plurality of information processing apparatuses via the crossbar 24 in the embodiment shown in FIG. 5.

According to the first and second embodiments of the information processing apparatus, it is possible to control the intensities of the laser beams output from the internal parallel optical module so as to satisfy a predetermined laser safety standard, and the output of the laser beams is automatically stopped if there is a possibility of not satisfying the predetermined laser safety standard. As a result, it is possible to positively secure safety, regardless of a failure or an abnormality within the information processing apparatus.

Further, the present invention is not limited to these embodiments, but various variations and modifications may be made without departing from the scope of the present invention.

What is claimed is:

1. A parallel optical module comprising:
   a plurality of photodetectors to detect output lights of a plurality of arbitrary channels of a laser light source having a plurality of channels, the number of channels of the plurality of channels of the laser light source being greater than the number of photodetectors of the plurality of photodetectors;
   a plurality of detection and control loops to detect and to control intensities of output lights of the laser light source based on detection signals from the plurality of photodetectors; and
   a control circuit to stop output of the laser light source when an intensity of output light detected by one or more of the plurality of detection and control loops does not satisfy a predetermined standard.

2. The parallel optical module as claimed in claim 1, wherein said laser light source is made up of a surface-emission laser.

3. The parallel optical module as claimed in claim 2, wherein:
   said surface-emission laser has the plurality of channels arranged linearly;
   said photodetectors include first and second photodetectors which detect output lights of channels on both ends of the linearly arranged plurality of channels; and
   said detection and control loops include first and second detection and control loops respectively corresponding to the first and second photodetectors.

4. The parallel optical module as claimed in claim 3, wherein said control circuit
   detects an intensity of output light in a second channel of the surface-emission laser by the second detection and control loop when controlling an intensity of output light in a first channel of the surface-emission laser by the first detection and control loop, and generates an abnormal signal if the intensity of light in at least one of the first and second channels does not satisfy the predetermined standard,
   detects the intensity of output light in the first channel of the surface-emission laser by the first detection and control loop when controlling the intensity of output light in the second channel of the surface-emission laser by the second detection and control loop, and generates an abnormal signal if the intensity of light in at least one of the first and second channels does not satisfy the predetermined standard, and
   stops the output of the surface-emission laser in response to said abnormal signal.

5. The parallel optical module as claimed in claim 3, wherein said control circuit generates an abnormal signal when an error of the intensities of output lights of the surface-emission laser detected by the first and second detection and control loops falls outside a tolerable range, and stops the output of the surface-emission laser in response to said abnormal signal.

6. An information processing apparatus comprising:
   a parallel optical module provided with a plurality of photodetectors to detect output lights of a plurality of arbitrary channels of a laser light source having a plurality of channels, a plurality of detection and control loops to detect and to control intensities of output lights of the laser light source based on detection signals from the plurality of photodetectors, and a control circuit to stop output of the laser light source when an intensity of output light detected by one or more of the plurality of detection and control loops does not satisfy a predetermined standard; and a processor to supply data of the plurality of channels to said control circuit, wherein the number of channels of the plurality of channels of the laser light source is greater than the number of photodetectors of the plurality of photodetectors.

7. The information processing apparatus as claimed in claim 6, wherein said laser light source is made up of a surface-emission laser.

8. The information processing apparatus as claimed in claim 7, wherein:

said surface-emission laser has the plurality of channels arranged linearly;

said photodetectors include first and second photodetectors which detect output lights of channels on both ends of the linearly arranged plurality of channels; and said detection and control loops include first and second detection and control loops respectively corresponding to the first and second photodetectors.

9. The information processing apparatus as claimed in claim 8, wherein said control circuit detects an intensity of output light in a second channel of the surface-emission laser by the second detection and control loop when controlling an intensity of output light in a first channel of the surface-emission laser by the first detection and control loop, and generates an abnormal signal if the intensity of light in at least one of the first and second channels does not satisfy the predetermined standard, detects the intensity of output light in the first channel of the surface-emission laser by the first detection and control loop when controlling the intensity of output light in the second channel of the surface-emission laser by the second detection and control loop, and generates an abnormal signal if the intensity of light in at least one of the first and second channels does not satisfy the predetermined standard, and stops the output of the surface-emission laser in response to said abnormal signal and supplies the abnormal signal to said processor.

10. The information processing apparatus as claimed in claim 8, wherein said control circuit generates an abnormal signal when an error of the intensities of output lights of the surface-emission laser detected by the first and second detection and control loops falls outside a tolerable range, and stops the output of the surface-emission laser in response to said abnormal signal and supplies said abnormal signal to said processor.

11. The parallel optical module as claimed in claim 4, wherein said control circuit generates an abnormal signal when an error of the intensities of output lights of the surface-emission laser detected by the first and second detection and control loops falls outside a tolerable range, and stops the output of the surface-emission laser in response to said abnormal signal.

12. The information processing apparatus as claimed in claim 9, wherein said control circuit generates an abnormal signal when an error of the intensities of output lights of the surface-emission laser detected by the first and second detection and control loops falls outside a tolerable range, and stops the output of the surface-emission laser in response to said abnormal signal and supplies said abnormal signal to said processor.

13. An apparatus comprising:

a laser outputting a plurality of output lights corresponding to a plurality of channels, respectively;

a first photodetector detecting intensity of a respective output light output by the laser;

a second photodetector detecting intensity of a respective output light output by the laser and which is different than the output light detected by the first photodetector; and a controller controlling the laser to control intensities of the plurality of output lights output by the laser in accordance with the intensities detected by the first and second photodetectors, wherein the controller stops output of the laser when an intensity detected by one or more of the first and second photodetectors does not satisfy a predetermined condition, and the number of channels of the plurality of channels is greater than the number of photodetectors detecting intensities of output lights.

14. The apparatus as claimed in claim 13, wherein the laser is a surface-emission laser.

15. The apparatus as claimed in claim 14, wherein:

the surface-emission laser has the plurality of channels in a linear arrangement having first and second ends;

the respective output light for which the first photodetector detects the intensity corresponds to a channel at the first end of the linear arrangement; and the respective output light for which the second photodetector detects the intensity corresponds to a channel at the second end of the linear arrangement.

16. An apparatus comprising:

a laser outputting a plurality of output lights corresponding to a plurality of channels, respectively;

a first photodetector detecting intensity of a respective output light output by the laser;

a second photodetector detecting intensity of a respective output light output by the laser and which is different than the output light detected by the first photodetector; and means for controlling the laser to control intensities of the plurality of output lights output by the laser in accordance with the intensities detected by the first and second photodetectors, and for stopping output of the laser when an intensity detected by one or both of the first and second photodetectors does not satisfy a predetermined condition, wherein the number of channels of the plurality of channels is greater than the number of photodetectors detecting intensities of output lights.

17. The apparatus as claimed in claim 16, wherein the laser is a surface-emission laser.

18. An apparatus comprising:

a laser outputting M output lights corresponding to M channels, respectively;

N photodetectors detecting intensity of N output lights, respectively, output by the laser, where N and M are integers, N is greater than or equal to two, and M is greater than N; and a controller controlling the laser to control intensities of the M output lights output by the laser in accordance with the intensities detected by the N photodetectors, wherein the controller stops output of the laser when an intensity detected by one or more of the N photodetectors does not satisfy a predetermined condition.

19. The apparatus as claimed in claim 18, wherein the laser is a surface-emission laser.

20. An apparatus comprising:

a laser outputting M output lights corresponding to M channels, respectively;

N photodetectors detecting intensity of N output lights, respectively, output by the laser, where N and M are integers, N is greater than or equal to two, and M is greater than N; and means for controlling the laser to control intensities of the M output lights output by the laser in accordance with the intensities detected by the N photodetectors, and for stopping output of the laser when an intensity detected by one or more of the N photodetectors does not satisfy a predetermined condition.

21. The apparatus as claimed in claim 20, wherein the laser is a surface-emission laser.

22. An apparatus to control a laser which outputs M output lights corresponding to M channels, respectively, the apparatus comprising:

N photodetectors to detect intensity of N output lights, respectively, output by the laser, where N and M are integers, N is greater than or equal to two, and M is greater than N; and a controller to control the laser to control intensities of the M output lights output by the laser in accordance with the intensities detected by the N photodetectors, so that the controller stops output of the laser when an intensity detected by one or more of the N photodetectors does not satisfy a predetermined condition.

23. The apparatus as claimed in claim 22, wherein the laser is a surface-emission laser.

24. An apparatus to control a laser which outputs M output lights corresponding to M channels, respectively, the apparatus comprising:

N photodetectors to detect intensity of N output lights, respectively, output by the laser, where N and M are integers, N is greater than or equal to two, and M is greater than N; and means for controlling the laser to control intensities of the M output lights output by the laser in accordance with the intensities detected by the N photodetectors, and for stopping output of the laser when an intensity detected by one or more of the N photodetectors does not satisfy a predetermined condition.

25. The apparatus as claimed in claim 24, wherein the laser is a surface-emission laser.

* * * * *